United States Patent [19]

Boyarsky et al.

[11] Patent Number: 4,733,631
[45] Date of Patent: Mar. 29, 1988

[54] APPARATUS FOR COATING SUBSTRATE DEVICES

[75] Inventors: David Boyarsky, Cherry Hill, N.J.; Robert T. Vaughan, Cheltenham, Pa.

[73] Assignee: Denton Vacuum, Inc., Cherry Hill, N.J.

[21] Appl. No.: 913,714

[22] Filed: Sep. 30, 1986

[51] Int. Cl.$^4$ ............................................. C23C 16/00
[52] U.S. Cl. ................................... 118/719; 118/715; 118/729
[58] Field of Search ...................... 118/715, 719, 729

[56] References Cited

U.S. PATENT DOCUMENTS

4,487,161 12/1984 Hirata ................................. 118/729
4,501,766 2/1985 Suzuki ................................. 118/729
4,545,328 10/1985 Fujiyama ........................... 118/719

*Primary Examiner*—Richard R. Bueker
*Attorney, Agent, or Firm*—William E. Cleaver

[57] ABSTRACT

The present apparatus has a movable table with apertures therein. In each aperture there is loaded a carrier device and each carrier holds a substrate to be coated. The carriers are advanced in a step-like fashion to a loading position under a vertical hollow cylinder. When a carrier is in the loading position, a piston is moved upward, passing through the aperture, pushing the carrier into the hollow cylinder. Each carrier has an O-ring on its periphery and the O-ring is squeezed against the cylinder wall to form a seal. Each carrier pushes against the one above it to advance a column of carriers upward in the hollow cylinder. In this way, the carriers, and the substrates they hold, pass through the hollow cylinder. Along the cylinder there are vacuum stations which act to pump down and degas the substrates. The degassed substrates eventually emerge from the upper end of the cylinder into a vacuum chamber, whereat they are coated by sputtering, or the like. The vacuum level in the coating chamber is not as low as the vacuum level at the vacuum stations along the cylinder. Accordingly, gasses in the coating chamber tend to try to escape into the vertical cylinder but are stopped by the O-ring seals on the carriers. Hence the coating chamber is not contaminated. The substrates are transmitted through the coating chamber, coated, and withdrawn therefrom through a second hollow cylinder.

13 Claims, 4 Drawing Figures

APPARATUS FOR COATING SUBSTRATE DEVICES

BACKGROUND OF THE INVENTION

The concept of continuously coating substrates has long been a desirable mode of operation and there are machines which can continuously sputter a coating of material (such as aluminum) onto a substrate. The present invention is described in connection with coating aluminum onto compact disk substrates. However, the present apparatus can be used to advantage in coating other types of substrates. With respect to coating compact disk substrates, heretofore in the prior art, it has been done by batch systems as well as by continuous systems which are best exemplified by a system developed by a European Company. In the prior art system the continuous machine is approximately twenty-two feet long. That prior art system is composed of one long single chamber which has many pumping stages to achieve the required low pressure as the substrates move therethrough. Ideally, the European system is housed in a "clean room" so that the chamber does not become contaminated which in turn would contaminate the substrates and provide inferior coatings. Substrates passing through the European prior art system are held in rectangular blocks and are arranged in a horizontal train as they pass through the single chamber. The sealing endeavor is extremely difficult because a large volume of air is entrapped around each rectangular carrier, which results in high leakage and accordingly many pumping stations are required. The seals which surround the blocks wear out rapidly because of the long horizontal excursion and require relatively frequent replacement. The European system has some undesirable aspects in that it is costly because of its size and its complexity. In addition it is costly because of the necessity of a large clean room. The prior art operation is a critical operation because of the many vacuum pumping stations in a single chamber. In a preferred embodiment the present apparatus is approximately seven feet long. The present apparatus is flexible (can be wheeled anywhere) and the present system does not require a clean room.

SUMMARY OF THE INVENTION

The present apparatus (in a preferred embodiment) has a circular rotatable table with apertures located therein toward the table's outer rim. The apparatus is ideally located in close proximity to the output station of a molding press so that a compact disk substrate coming from a molding press is directly loaded into one of the apertures in the rotatable table. If the press fabricates a compact disk substrate every certain number of seconds, for instance, every nine seconds, then the movement of the loading table is synchronized to have an empty aperture available to the molding press every nine seconds. In this way one substrate is coated and leaves the coating machine every nine seconds. In a preferred embodiment a hood is located, or disposed, over the area between the molding press output station and the aperture location on the loading table which receives such substrates. A "clean air" blower is located adjacent to, or within, the hood and that blower blows "clean air" across the area including the press output section and the loading table. In this way, the clean substrates from the press are kept clean without the expense and inflexibility which are dictated by the necessity of a large and completely enclosing "clean room."

Each substrate is held by a carrier. In a preferred embodiment the carrier is circular in shape and has a O-ring around the periphery thereof. The carriers holding the substrates are pushed from the apertures in the loading table into a vertical hollow cylinder. The O-rings are squeezed as they pass through the hollow cylinder and thus they form a seal to prevent gasses from passing between the wall of the hollow cylinder and the O-ring. As each carrier enters the hollow cylinder it pushes the one above and therefore a train of carriers is advanced through the hollow cylinder. In a preferred embodiment the hollow cylinder has apertures therein at two sections and at those two sections there are vacuum chambers mounted to surround those apertures. These two vacuum chambers pump the cylinder sections down and create vacuum conditions in those sections thereby causing substrates passing through those sections to be pumped and degassed. The degassed substrates are advanced in a step-like motion and each eventually exits from the vertical hollow cylinder into a coating chamber. The coating chamber is a vacuum stage but it is not held at the low vacuum condition that the last vacuum stage along the hollow cylinder is held. Accordingly, the gas in the coating chamber attempts to escape into the vertical hollow cylinder but the seals effected by the O-rings prevents the gas from escaping. The entry of air and contaminants into the coating chamber is minimized because of the sealing effect of the O-rings and further because the gas pressure "push" is in the opposite direction (i.e. from the coating chamber toward the last vacuum stage along the hollow cylinder).

In the coating chamber each carrier is lifted from the exit position of the hollow cylinder and moved toward the coating station. In an alternative embodiment each substrate can be first cleaned at a cleaning station before it gets to the coating station. Each substrate is advanced in a step-like fashion and remains in a coating position in the coating station for a specific time since the step movement is synchronized to permit the same. The coating is slightly delayed until the substrate is fully into position and then the coating is fully effected. Thereafter the coated substrate is pushed down a second hollow cylinder back into atmosphere and onto the loading table and lifted therefrom.

The objects and features of the present invention will be better understood when the description below is studied in connection with the drawings wherein:

FIG. 1A is a top view of a substrate carrier while

Figure 1A:
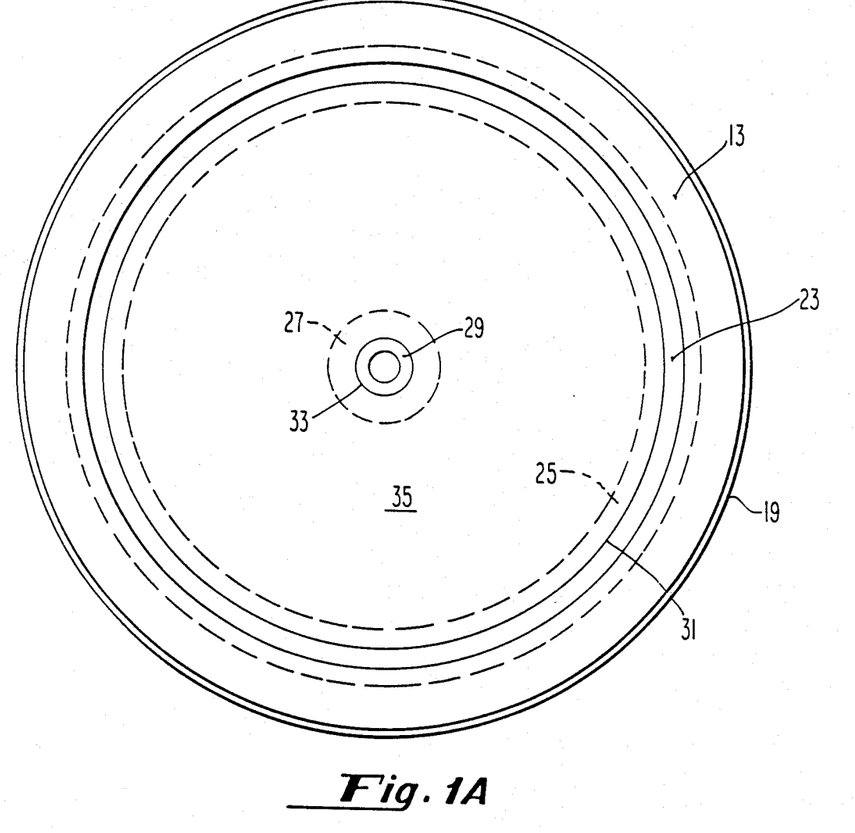
Figure 1B:
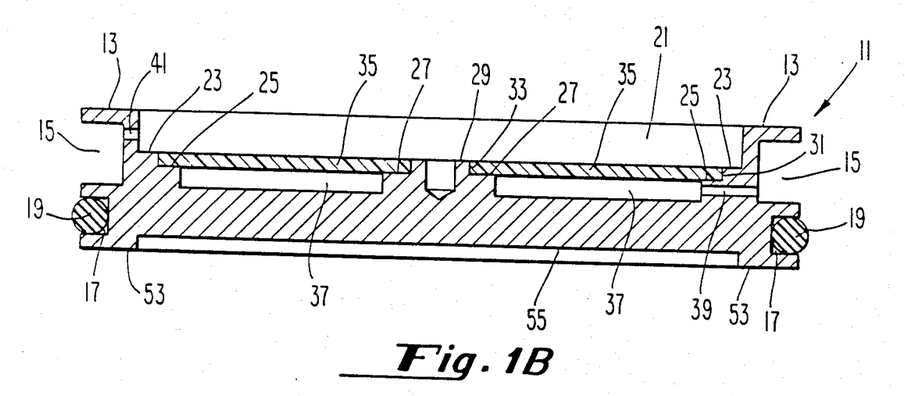
FIG. 1B is a end view on the bottom side of the carrier shown in FIG. 1A.

Consider FIGS. 1A and 1B. In FIGS. 1A and 1B there is shown a carrier 11. The carrier has an upper outer ledge 13. Beneath the upper ledge 13, as can be gleaned from FIG. 1B, there is formed an upper channel 15. The upper channel 15 (as will become more meaningful in the discussion of FIG. 3) serves to work with a lifting device to lift the carrier from the hollow cylinder exit onto the rails of a transport apparatus. As can be gleaned from FIG. 1B, below the upper channel 15 there is formed a lower channel 17 into which there is located an O-ring 19. The O-ring 19 acts to effect a seal when the carrier 11 is pushed into the vertical hollow cylinder. When the carrier is pushed, the O-ring is squeezed and its elastic nature forces it against the wall of the cylinder thereby creating a seal. It should be understood that other forms of gaskets or seal devices can be employed in place of the O-rings.

As can be further seen in FIG. 1B, there is large aperture 21 formed at the top of the carrier 11. The aperture has two step ledges 23 and 25. The ledge 25 has an associate ledge 27 while ledge 23 has an associate ledge 29. The vertical walls 31 and 33 which provide the step configuration between the ledges 23 and 25 and 29 and 27, respectively, provide a means to hold the compact disk 35 in horizontal position. In other words, the compact disk 35 is fitted into the upper aperture and more precisely to rest on the ledges 25 and 27 and to be secured therein by the vertical walls 31 and 33. As is shown in FIG. 1B, below the compact disk 35 is an open space 37. The open space 37 provides a means for readily degassing the compact disk substrate on the lower side. It should be noted that entering the space 37 is a channel 39. It should also be noted that entering the aperture 21 is a shorter channel 41. While in the sectional view of FIG. 1B there is only shown one channel 39 and one channel 41, actually there are many such channels (i.e. there are many channels similar to channel 39 and many channels similar to channel 41.) As will be better understood (when we discuss the movement of the carrier through the vertical horizontal cylinder), when the carriers get to the vacuum stages, which lie along the hollow cylinder, the degassing of the substrate is accomplished on the lower side through the space 37 and the channels 39 and on the upper side through the aperture 21 and the channels 41.

Figure 2:
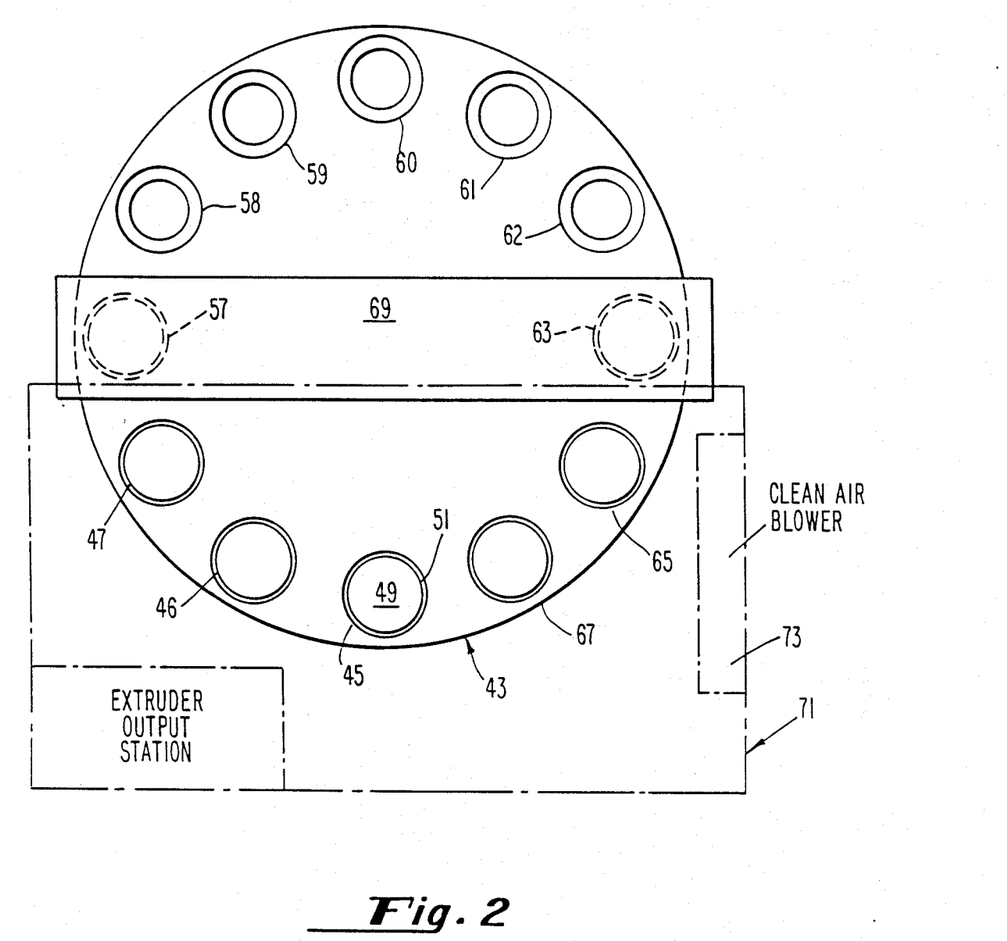
FIG. 2 depicts a top view of the systems and in particular shows the loading table and its relationship to the loading position under the hollow cylinder.

Consider now FIG. 2 which depicts the rotating load and unload table 43. As can be seen in FIG. 2 the load and unload table 43 has a plurality of apertures such as apertures 45, 46 and 47 around the outer section of the table. The apertures are formed to be completely open through the table in the area 49 and yet have a ledge 51 which is formed to hold the lower ledge 53 of the carrier (see ledge 53 in FIG. 1B). In other words the carrier fits into the aperture, such as aperture 45, with ledge 53 coming in abutment with the ledge 51. In this way a piston is able to push through the open area 49 come in contact with the surface 55 (shown in FIG. 1B) in order to lift the entire carrier out of the aperture 45. The driving mechanism for the load/unload table is not shown and in the preferred embodiment it is a Geneva Indexing System but it could be other forms of motor driven devices which will step the load/unload table in a clockwise direction. In FIG. 2 it can be seen that there is a molding press output station shown in phantom. The substrates are taken from the press output station and loaded into a carrier which is sitting in the position shown by the aperture 46. Shortly after a substrate is loaded into a carrier, at position 46, that carrier is advanced to the position shown by the aperture 47. This of course provides an "empty slot" in the carrier which is in the position 46 and which is awaiting the reception of a new substrate from the press. In the following period the load/unload table is advanced one more step so that the carrier which was first loaded in position 46 is now in position 57. The last mentioned carrier will be lifted from the table at position 57 and pushed into the hollow cylinder as will be explained more completely hereinafter. The apertures remain empty on the excursion along positions 58, 59, 60, 61 and 62 so that they are ready to receive a carrier at the output position 63. The carrier loaded into position 63 is holding a substrate that has been coated. As will become more meaningful hereinafter after the substrates are coated, the carriers are pushed downward through a hollow cylinder at position 63 and are loaded one at a time into a waiting empty aperture in the load/unload table 43. An unloaded carrier is advanced to positions 65 and 67 and may be lifted from the table at position 67, or a subsequent position, by the operator of the system or automatically as the case may be. An empty carrier (i.e. without a substrate) is present at the aperture position 45 to await loading of a compact disk substrate at position 46 and the operation repeats itself.

Figure 3:
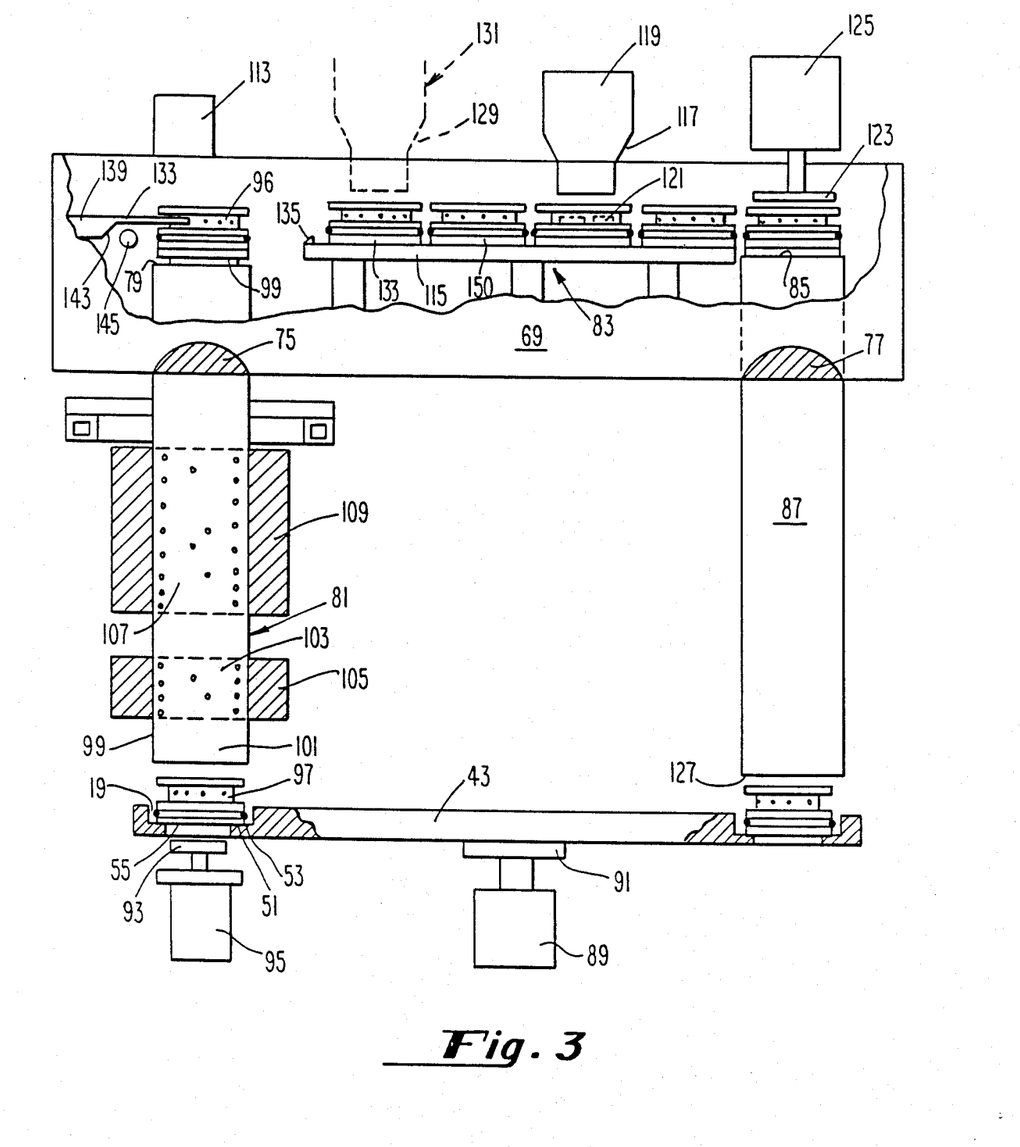
FIG. 3 is a schematic layout depicting the vertical hollow cylinder and the vacuum stations through which it passes as well as the coating chamber.

As can be recognized from FIG. 2 the coating chamber 69 straddles the load/unload table and as will become more meaningful from the discussion of FIG. 3, the carriers are pushed vertically into the coating chamber 69 and are then moved from left to right (as viewed in FIG. 2) and are pushed downward out of the coating chamber 69 at the position 63. FIG. 2 is shown in a simple form and it should be understood that there are support braces, mechanisms for pumping the loading chamber down into a suitable vacuum condition, and further devices to effect the coating experience itself such as a sputtering device or means for creating a plasma all of which are not shown. None of these devices are shown in order that concepts of the present invention can be more clearly understood.

In FIG. 2 there is shown in phantom a hood 71 which spans the area in which the apertures 46 and 47 as well as the press output station are located. The hood 71 has a blower 73 which blows "clean air" across the area so that the substrates which come from the press output station and are placed in a carrier at position 46 do not become contaminated. The hood 71 may be a Class 100 unit utilizing Hepa filters but could be a commercial hood such as the kind that are sold by Laminaire Corporation. The hood 71, along with the "clean air" blower 73, effects a relatively small local clean room characteristic for the present device but reduces the expenses that go along with an actual large clean room setting as is required by the prior art systems.

Consider FIG. 3 which depicts a schematic side view of the present apparatus. As can be seen in FIG. 3 there is a coating chamber 69 which is supported by two support braces 75 and 77. The wall of the chamber 69 is "broken away" to show the exit position 79 of the hollow cylinder 81. The "broken away" section also shows the transport arrangement 83 and the entry position 85 of the hollow cylinder 87. As can be seen in FIG. 3, the load/unload table 43 is driven by an indexing device 89 which is fastened to the table 43 by the plate 91. Also as can be seen in FIG. 3, the lower ledge 53 (which was discussed in connection with the discussion of FIG. 1) is shown resting on the ledge 51 (which was discussed in connection with the discussion of FIG. 2). The lower surface 55, as seen in FIG. 3, is awaiting contact with the piston 93. The piston 93 is driven by a piston driving mechanism 95 which in the preferred embodiment is an air cylinder manufactured by Lin Act Co. but other forms of piston driving mechanisms can be used. The piston 93 is driven upward to come in contact with the surface 55 and in response thereto the carrier 97 is driven into the hollow cylinder 81. As can be seen in FIG. 3, the O-ring 19 is shown protruding from the carrier 97 so that as the carrier 97 is pushed into the hollow cylinder 81 the O-ring will be squeezed inward but will be providing a force outward to form a seal between the wall 99 and the O-ring 19. The carrier 97 will be advanced to the position 101 and will remain at that position in response to the friction of the O-ring against the side walls as well as the pressure differential between atmospheric pressure being applied to the bottom of the carrier and a lesser pressure being effected in the section 103 of the hollow cylinder because of the vacuum pump down station 105. While it appears from the drawing that only one carrier would be held in sections 101 and 103, in the preferred embodiment the vertical hollow cylinder will hold a number of such carriers. When the next carrier which is similar to the carrier 97 is pushed by the piston 93 into the hollow cylinder 81 it advances the previous carrier one space forward toward the section 103. Now it should be borne in mind that the O-rings are maintaining a seal so that the vacuum condition effected in section 103 is not disturbed by any atmospheric conditions which may exist below the carriers which are entering the hollow cylinder 81. Section 103 in the preferred embodiment is of sufficient depth to accommodate three carriers. While the carriers are in the section 103, the air is pumped out so that section 103 has a vacuum of about 100 Torr. As mentioned earlier (in connection with the discussion of FIG. 1B), there are channels cut through the carrier channel 15 below the compact disk substrate, and channels which enter the carrier above the compact disk substrate, so when the pumping mechanism in the vacuum pump down chamber 105 is operating, the air and the gas contaminants are withdrawn from the substrates thereby starting the preparation of those substrates for subsequent coating.

As more carriers are pushed from the load/unload table 43, into the hollow cylinder 81 a train of carriers is advanced along the hollow cylinder 81. When such carriers leave the area 103 they are partially pumped and degassed and they pass through a nonporous section of the hollow cylinder 81 into a second vacuum section 107. In the second vacuum section 107 there is a plurality of apertures in the hollow cylinder 81 which enable the second vacuum pump station 109 to pump the section 107 to a lower pressure condition. In a preferred embodiment the vacuum condition in the section 107 is $5 \times 10^{-5}$ Torr which enables a greater degassing effect to take place (on the compact disk substrates present in section 107) than was accomplished in section 103. The concept of staged vacuum pump downs is well understood and that is what is accomplished in the vacuum step down between the sections 103 and 107. The apertures in sections 103 and 107 are arranged so that bridging will not take place between the second vacuum stage and the first vacuum stage. In a preferred embodiment the pump 105 is an Alcotell Direct Two Stage Pump while the pump 109 is a CT-7 cryopump manufactured by CTI Company. It should be understood that other equivalent high vacuum pumps can be employed.

The carriers continue to advance out of the vacuum section 107 into the nonporous section 111 and on into the loading chamber 69 heading toward the exit position 79. In a preferred embodiment the coating chamber 69 is pumped through the pumping mechanism 113 to a vacuum condition of 1 to 4 Torr. The vacuum condition in coating chamber 69 is obtained by balancing the injection of Argon gas while pumping through a throttling aperture. Gas quantities and pumping speed are selected to minimize contamination. Accordingly, there is a higher pressure of gas in the coating chamber 69 than there is in the vacuum section 107 and the gas attempts to escape through into the vertical hollow cylinder 81. However there is a plurality of carriers between the exit position 79 and the chamber 107 and the seals effected by the O-rings of this plurality of carriers prevents gas from escaping from the chamber 69 into the vacuum section 107. This reverse pressure of clean sputtering gas acts to flush the coating chamber 69 free of contaminants, and thus enables the compact disk substrates to be transported through the coating operation in a relatively uncontaminated form.

When a carrier, such as the carrier 96, arrives at the exit position 79, it is lifted from the following carrier such as carrier 99 onto a set of rails such as rail 115. As each carrier, such as carrier 96, is moved in a rightward direction (as viewed in FIG. 3) it pushes the train of carriers before it into a position so that a "new" carrier is under the hood 117. The hood 117 controls the coating material emanating from the chamber 119 so that the coating material is concentrated on the substrate directly under the source. In FIG. 3 there is shown a disk 121, in phantom, beneath the outer limits of the hood. Note that the carrier in FIG. 3 which is holding the disk 121 has the ledges positioned so that unwanted deposition of the material beyond the substrate is restricted.

As can be seen in FIG. 3 the carriers advance rightward until they reach the exit position 85. A carrier is pushed off the rails (115) and come to rest against the top of a previously unloaded carrier. After a carrier is in that position, the piston 123 is moved downward by the piston drive mechanism 125 and it pushes the carrier into vertical chamber 87. Accordingly there is a train of carriers located in the hollow cylinder 87 and this train is pushed downward as was described in connection with the pushing up of the carriers in the vertical hollow cylinder 81. Eventually, carriers emerge from the hollow cylinder 87 at the exit position 127 and are loaded back onto the load/unload table 43.

It should be understood that a cleaning station can be located along the transport mechanism prior to compact disk substrate reaching the coating position under hood 117. In other words the hood mechanism 129 shown in phantom along with the plasma generator 131 can be installed so that substrates located on a carrier (in the position of carrier 133) can be cleaned by ion cleaning. Such cleaning insures that those surfaces can be in the proper condition to be coated when they come under the hood 117. We have found that if the substrates are directly loaded from the press onto the load/unload table 43 as earlier described then the degassing of such substrates is sufficient to put the substrates in a condition to be coated without the necessity of ion cleaning. However in some forms of substrates ion cleaning may be necessary and such ion cleaning can take place in the coating chamber without disrupting the continuous flow of the substrates through the system.

As can be further seen in FIG. 3 the mechanism to lift the carriers from the vertical hollow cylinder 81 is shown. It should be understood that in a preferred embodiment the device 133 is U shaped. The U shaped device 133 has a pair of arms. The U shaped device 133 is held by an arm 139 which is connected to a transfer mechanism not shown. The energization of the transfer mechanism is synchronized to the movement of the load/unload table and hence when a train of carriers has been moved by the piston, as described earlier, and the top most carrier 96 is in the position shown in FIG. 3, then the transfer mechanism is energized. When the transfer mechanism is energized, the arm 139 moves rightward pushing the U shaped device 133 to engage the top most carrier 96. This can be understood from FIG. 3. When the cam section 143 of the arm 139 reaches the roller device 145 the cam lifts the U shaped device 133 thus lifting the carrier 96 vertically away from the carrier 99. The lifting away is important to prevent the rubbing of the materials between the carriers 96 and 99 so that these rubbed materials do not contaminate the substrates or the coating chamber 69. At the same time that the carrier 96 is lifted vertically away, it is also pushed rightward to push the clip mechanism 135 downward. Now as can be seen in FIG. 3, the previously unloaded carrier 133 has been moved the clip height rightward because the clip gets moved down as the carriers move rightward. In the operation we are discussing the carrier 96 will be moved rightward and will abut the carrier 133 (meanwhile the clip 135 will be depressed) and move the carrier 133 rightward. At the proper time the transfer mechanism will return the arm 139 to its home position, thus returning the U shaped mechanism to the position shown in FIG. 3.

It should be understood that some discrete amount of time takes place to move the carriers from position 150 to the position under the hood 117. During that discrete time which in the preferred embodiment is approximately two seconds, the coating source which is responsive to voltage, is deactivated. When the carrier is located under the hood 117 so that the substrate 121 is in position to receive the coating, then the coating source is activated and the material is coated onto the substrate 121.

The present apparatus provides a means to continuously, in a step like fashion, coat substrates in a system which is: portable; relatively inexpensive; includes the viable aspects of the clean room; and can accommodate a substrate supply means such as a molding press. It should be borne in mind that the speed of the load/unload table can be changed to accommodate different substrate input rates. It should also be understood that while the entire discussion has been in connection with a compact disk substrate other forms of substrates could be used. The present system enables the degassing of the substrates, which is so necessary, to take effect during a vertical excursion by employing the technique of employing carriers which not only carry the substrates but create a seal. With such a technique a two staged pump down can be readily accomplished. In addition the pressure gradient between the coating chamber and the last degassing chamber is reversed to flush contaminants and prevent contaminants from entering the coating chamber.

We claim:

1. An arrangement for coating substrates which are held by individual carrier means and which carrier means are continuously step moved into and out of a coating chamber, comprising in combination: sealing devices respectively fitting on associated ones of said carrier means; first vertical elongated cavity means having first and second ends and having sidewall means and having apertures in at least one section of said sidewall means, said first vertical elongated cavity means designed to have said carrier means with said sealing devices fit therein to provide a substantial seal to prevent gasses from passing between said carriers and said sidewall means; means for loading said carrier means designed and disposed to move said carrier means into said first vertical elongated cavity means whereby a train of said carrier means is moved through said first vertical elongated cavity means; vacuum pump means disposed to be in close proximity to said at least one section of said first elongated cavity means to create a vacuum in said at least one section to thereby degas substrates held by said carrier means located in said at least one section; transport means designed and disposed to move said carrier means which have passed through said first elongated cavity means; and vacuum chamber coating means designed to house said transport means, said vacuum chamber coating means further designed to house means to materially coat said substrates, said means to materially coat disposed with respect to said transport means to materially coat said substrates which are being moved by said transport means; and means to remove said carrier means from said transport means and from said vacuum chamber coating means.

2. An arrangement for coating substrates according to claim 1 wherein said first vertical elongated cavity means is a hollow cylinder.

3. An arrangement for coating substrates according to claim 1 wherein said vacuum pumping means is formed to surround said at least one section and wherein said at least one section is pumped down to a vacuum level which is lower a vacuum level than in said vacuum chamber coating means.

4. An arrangement for coating substrates according to claim 1 wherein there is included a second section of said sidewall means having apertures therein and wherein said vacuum pumping means includes first and second high vacuum pumps with said first high vacuum pump disposed in close proximity to said at least one section of said sidewall means and said second high vacuum pump disposed in close proximity to said second section of said sidewall means to respectively provide first and second vacuum level sections along said first vertical elongated cavity means.

5. An arrangement for coating substrates according to claim 4 wherein the gas pressure in said at least first section is higher than the gas pressure in said second section and wherein the gas pressure in said vacuum chamber coating means is higher than the gas pressure in said second section.

6. An arrangement for coating substrates according to claim 1 wherein said sealing devices are O-rings.

7. An arrangement for coating substrates according to claim 6 wherein said O-rings are fabricated from resilient material.

8. An arrangement for coating substrates according to claim 6 wherein said carrier means have first channels cut therein around their respective peripheries and wherein said O-rings are disposed in said first channels.

9. An arrangement for coating substrates according to claim 1 wherein said transport means includes means to vertically lift each carrier means, which has passed through said first vertical elongated cavity, from a carrier means which is following it in said first vertical elongated cavity.

10. An arrangement for coating substrates according to claim 1 wherein said carrier means loading means includes a table means having at least one aperture therein to hold a carrier means and wherein there is included a piston device disposed to push through said at least one aperture to push said carrier into said first vertical elongated cavity means.

11. An arrangement for coating substrate according to claim 10 wherein said table means is a substantially round table and is rotatable and wherein said rotatable round table has a plurality of apertures each designed to hold a carrier means.

12. An arrangement for coating substrates according to claim 1 wherein there is included in said vacuum chamber coating chamber a means to clean substrates and wherein said means to clean substrates is disposed with respect to said transport means and said means to materially coat so that substrates being transported by said transport means pass under said means to clean substrates before they pass under said means to materially coat.

13. An arrangement for coating substrates according to claim 1 wherein said means to remove said carrier means from said vacuum chamber coating means includes a second vertical elongated cavity means.

* * * * *

REEXAMINATION CERTIFICATE (1942nd)

United States Patent [19]
Boyarsky et al.

[11] B1 4,733,631
[45] Certificate Issued Mar. 9, 1993

[54] APPARATUS FOR COATING SUBSTRATE DEVICES

[75] Inventors: David Boyarsky, Cherry Hill, N.J.; Robert T. Vaughan, Cheltenham, Pa.

[73] Assignee: Denton Vacuum Inc., Cherry Hill, N.J.

Reexamination Request:
No. 90/002,163, Oct. 12, 1990

Reexamination Certificate for:
| | |
|---|---|
| Patent No.: | 4,733,631 |
| Issued: | Mar. 29, 1988 |
| Appl. No.: | 913,714 |
| Filed: | Sep. 30, 1986 |

[51] Int. Cl.$^5$ ............................................. C23C 16/00
[52] U.S. Cl. .................................. 118/719; 118/715; 118/729; 414/217; 204/192.3; 204/298.25
[58] Field of Search ...................... 118/715, 719, 729; 414/217; 204/192.3, 298.25

[56] References Cited

U.S. PATENT DOCUMENTS

| | | | |
|---|---|---|---|
| 3,486,365 | 12/1969 | Briggs | 73/40.7 |
| 3,756,435 | 9/1973 | Steigerwald | 414/217 |
| 3,968,018 | 7/1976 | Lane | 204/192.3 |
| 4,266,111 | 5/1981 | Trillwood | 414/217 |
| 4,379,743 | 4/1983 | Nakatsukasa | 204/298.25 |
| 4,487,161 | 12/1984 | Hirata | 118/729 |
| 4,501,766 | 2/1985 | Suzuki | 118/729 |
| 4,523,985 | 6/1985 | Dimock | 204/298.25 |
| 4,545,328 | 10/1985 | Fujiyama | 118/719 |
| 4,592,306 | 6/1986 | Gallego | 118/733 |
| 4,649,830 | 3/1987 | Tanaka | 414/217 |
| 4,701,251 | 10/1987 | Beardow | 414/217 |
| 4,749,465 | 6/1988 | Flint | 204/298.25 |
| 4,756,815 | 7/1988 | Turner | 204/298.25 |

FOREIGN PATENT DOCUMENTS

| | | | |
|---|---|---|---|
| 55-49136 | 4/1980 | Japan | 118/724 |
| 59-23871 | 2/1984 | Japan | 204/298.25 |

OTHER PUBLICATIONS

Charschan, "A Continuous Vacuum Processing Machine", The Western Electric Engineer, Apr. 1963, vol. VII, No. 11, pp. 9–17.
Hanfmann, "Some Developments in Continuous Sputtering", Solid State Technology, Dec. 1968, pp. 37–41.
Maissel, Hardbook of Thin Film Technology, McGraw-Hill, Inc., N.Y., ©1970, pp. 2-97 to 2-111.

*Primary Examiner*—Richard Bueker
*Attorney, Agent, or Firm*—William E. Cleaver

[57] ABSTRACT

The present apparatus has a movable table with apertures therein. In each aperture there is loaded a carrier device and each carrier holds a substrate to be coated. The carriers are advanced in a step-like fashion to a loading position under a vertical hollow cylinder. When a carrier is in the loading position, a piston is moved upward, passing through the aperture, pushing the carrier into the hollow cylinder. Each carrier has an O-ring on its periphery and the O-ring is squeezed against the cylinder wall to form a seal. Each carrier pushes against the one above it to advance a column of carriers upward in the hollow cylinder. In this way, the carriers, and the substrates they hold, pass through the hollow cylinder. Along the cylinder there are vacuum stations which act to pump down and degas the substrates. The degassed substrates eventually emerge from the upper end of the cylinder into a vacuum chamber, whereat they are coated by sputtering, or the like. The vacuum level in the coating chamber is not as low as the vacuum level at the vacuum stations along the cylinder. Accordingly, gasses in the coating chamber tend to try to escape into the vertical cylinder but are stopped by the O-ring seals on the carriers. Hence the coating chamber is not contaminated. The substrates are transmitted through the coating chamber, coated, and withdrawn therefrom through a second hollow cylinder.

REEXAMINATION CERTIFICATE ISSUED UNDER 35 U.S.C. 307

THE PATENT IS HEREBY AMENDED AS INDICATED BELOW.

Matter enclosed in heavy brackets [ ] appeared in the patent, but has been deleted and is no longer a part of the patent; matter printed in italics indicates additions made to the patent.

AS A RESULT OF REEXAMINATION, IT HAS BEEN DETERMINED THAT:

Claims 1, 3-5 and 13 are cancelled.

Claims 2, 6, 9, 10, and 12 are determined to be patentable as amended.

Claims 7, 8 and 11, dependent on an amended claim, are determined to be patentable.

New claims 14-18 are added and determined to be patentable.

2. An arrangement for coating substrates according to claim [1] *14* wherein said first vertical elongated cavity means is a hollow cylinder.

6. An arrangement for coating substrates according to claim [1] *14* wherein said sealing devices are O-rings.

9. An arrangement for coating substrates according to claim [1] *14* wherein said transport means includes means to vertically lift each carrier means, which has passed through said first vertical elongated cavity, from a carrier means which is following it in said first vertical elongated cavity.

10. An arrangement for coating substrates according to claim [1] *14* wherein said carrier means loading means includes a table means having at least one aperture therein to hold a carrier means and wherein there is included a piston device disposed to push through said at least one aperture to push said carrier into said first vertical elongated cavity means.

12. An arrangement for coating substrates according to claim [1] *14* wherein there is included in [said vacuum chamber coating chamber a means to clean substrates and wherein said means to clean substrates is disposed with respect to said transport means and] said means to materially coat, *a hood means so that carriers carrying* substrates being [transported by said transport means pass under said means to clean substrates before they pass under said means to materially coat] *coated remain substantially uncoated.*

*14. An arrangement for coating a plurality of substrates, each of which substrates, is formed to have a generally planar upperside upon which a coating is intended to be deposited and an underside, comprising in combination: a plurality of carrier means with one each holding an associated different one of said substrates, each of said carrier means formed to have said underside of its associated substrate nested therein to form a first open space above the substrate and a second open space below the substrate and each of said carrier means formed to have aperture means therein in close proximity to said underside of its associated substrate, to readily enable degassing of its associated substrate, said aperture means including a first aperture means connected to said first open space and a second aperture means connected to said second open space;*

*a plurality of sealing devices, each of which is securely fitted onto a different associated one of said carrier means whereby each of said sealing devices moves with its associated carrier means;*

*first vertical elongated cavity means, having first and second ends and having a vertical central axis extending from the first end to the second end, and having sidewall means and having a plurality of apertures in at least one section of said sidewall means;*

*said first vertical elongated cavity means, designed to have said plurality of carrier means move in a train-like formation in a vertical direction therethrough with the uppersides of the substrates held generally normal to said central axis and further designed to enable each of said carrier means to hold its associated sealing device firmly against said sidewall means whereby, as each of said sealing devices moves, with its associated carrier means, through said first vertical section, to be degassed via said first and second aperture means and to have contaminate material removed by the degassing;*

*transport means, designed and disposed to move said carrier means which have passed through said first elongated cavity means;*

*vacuum chamber coating means, designed to house said transport means, said vacuum chamber coating means including pump means which is formed to maintain the pressure, in said vacuum chamber coating means, at a pressure which is higher than said high vacuum condition in said at least one section, said vacuum chamber coating means further designed to house means to materially coat said substrates, said means to materially coat disposed with respect to said transport means and formed to materially coat said substrates, which are being moved by said transport means;*

*and, means to remove said carrier means from said transport means and from said vacuum chamber coating means.*

*15. An arrangement for coating substrates according to claim 14 wherein said high vacuum pump means is formed to surround said at least one section.*

*16. An arrangement for coating substrates according to claim 14 wherein there is included a second section of said sidewall means, said second section having a plurality of apertures therein, and wherein said high vacuum pump means includes first and second high vacuum pumps means, said first high vacuum pump means being disposed to cover said apertures in said at least one section of said sidewall means and said second high vacuum pump means disposed to cover said plurality of apertures in said second section of said sidewall means to respectively provide first and second vacuum level sections along said first vertical elongated cavity means.*

*17. An arrangement for coating substrates according to claim 16 wherein the gas pressure in said at least first section is lower than the gas pressure in said second section and wherein the gas pressure in said vacuum chamber coating means, is higher than the gas pressure in said at least first section.*

*18. An arrangement for coating substrates according to claim 14 wherein there is further included at said first end of said first vertical elongated cavity means, a clean air blower means, which is designed and acts to blow clean air across substrates which leave a substrate press station.*

* * * * *